(12) United States Patent
Van Der Laan et al.

(10) Patent No.: US 12,228,862 B2
(45) Date of Patent: Feb. 18, 2025

(54) SELECTION OF MEASUREMENT LOCATIONS FOR PATTERNING PROCESSES

(71) Applicant: ASML NETHERLANDS B.V., Veldhoven (NL)

(72) Inventors: Hans Van Der Laan, Veldhoven (NL); Wim Tjibbo Tel, Helmond (NL); Marinus Jochemsen, Sunnyvale, CA (US); Stefan Hunsche, Santa Clara, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 18/207,732

(22) Filed: Jun. 9, 2023

(65) Prior Publication Data
US 2023/0333481 A1    Oct. 19, 2023

Related U.S. Application Data

(63) Continuation of application No. 17/214,456, filed on Mar. 26, 2021, now Pat. No. 11,681,229, which is a continuation of application No. 16/067,303, filed as application No. PCT/EP2016/081195 on Dec. 15, 2016, now Pat. No. 10,962,886.

(60) Provisional application No. 62/273,662, filed on Dec. 31, 2015.

(51) Int. Cl.
*G03F 7/00* (2006.01)
*G06F 30/398* (2020.01)
*H01L 21/66* (2006.01)

(52) U.S. Cl.
CPC .......... *G03F 7/705* (2013.01); *G03F 7/70608* (2013.01); *G03F 7/70616* (2013.01); *G03F 7/70625* (2013.01); *G03F 7/7065* (2013.01); *G06F 30/398* (2020.01); *H01L 22/20* (2013.01); *H01L 22/12* (2013.01)

(58) Field of Classification Search
USPC .......................................................... 716/51
See application file for complete search history.

(56) References Cited

U.S. PATENT DOCUMENTS

| | | |
|---|---|---|
| 5,229,872 A | 7/1993 | Mumola |
| 5,296,891 A | 3/1994 | Vogt et al. |
| 5,523,193 A | 6/1996 | Nelson |

(Continued)

FOREIGN PATENT DOCUMENTS

| | | | | |
|---|---|---|---|---|
| KR | 101613048 B1 | * | 11/2006 | ............. G06T 15/06 |
| WO | 2015/110191 | | 7/2015 | |

OTHER PUBLICATIONS

Search Report and Written Opinion issued in International Patent Application No. PCT/EP2016/081195, dated Apr. 19, 2017.

*Primary Examiner* — Mohammed Alam
(74) *Attorney, Agent, or Firm* — Pillsbury Winthrop Shaw Pittman LLP

(57) ABSTRACT

A process of selecting a measurement location, the process including: obtaining pattern data describing a pattern to be applied to substrates in a patterning process; obtaining a process characteristic measured during or following processing of a substrate, the process characteristic characterizing the processing of the substrate; determining a simulated result of the patterning process based on the pattern data and the process characteristic; and selecting a measurement location for the substrate based on the simulated result.

20 Claims, 10 Drawing Sheets

(56) References Cited

U.S. PATENT DOCUMENTS

| | | | |
|---|---|---|---|
| 5,969,441 A | 10/1999 | Loopstra et al. | |
| 6,046,792 A | 4/2000 | Van Der Werf et al. | |
| 7,587,704 B2 | 9/2009 | Ye et al. | |
| 9,355,200 B2* | 5/2016 | Chen | G03F 7/70633 |
| 10,726,169 B2 | 7/2020 | Adel et al. | |
| 2002/0165636 A1 | 11/2002 | Hasan | |
| 2003/0010912 A1 | 1/2003 | Archie | |
| 2003/0229410 A1 | 12/2003 | Smith et al. | |
| 2004/0102934 A1 | 5/2004 | Chang | |
| 2004/0121495 A1 | 6/2004 | Sonderman et al. | |
| 2005/0071036 A1 | 3/2005 | Mitrovic | |
| 2005/0136340 A1 | 6/2005 | Baselmans | |
| 2006/0039596 A1 | 2/2006 | Nojima et al. | |
| 2006/0247818 A1 | 11/2006 | Hasan | |
| 2007/0050749 A1 | 3/2007 | Ye et al. | |
| 2008/0147374 A1 | 6/2008 | Chan et al. | |
| 2008/0239308 A1 | 10/2008 | Ravid | |
| 2008/0279442 A1 | 11/2008 | Den Boef et al. | |
| 2008/0316442 A1* | 12/2008 | Adel | G03F 7/70258 355/52 |
| 2009/0007030 A1 | 1/2009 | Nehmadi et al. | |
| 2009/0031261 A1 | 1/2009 | Smith et al. | |
| 2009/0157360 A1 | 1/2009 | Ye et al. | |
| 2010/0096550 A1 | 4/2010 | Yamazaki et al. | |
| 2010/0151364 A1 | 6/2010 | Ye et al. | |
| 2010/0202654 A1 | 8/2010 | Matsuoka et al. | |
| 2012/0124529 A1 | 5/2012 | Feng et al. | |
| 2012/0208301 A1 | 8/2012 | Izikson et al. | |
| 2013/0179847 A1 | 7/2013 | Hansen | |
| 2014/0141536 A1* | 5/2014 | Levinski | G03F 7/70683 356/399 |
| 2014/0354969 A1 | 12/2014 | Elings et al. | |
| 2015/0186581 A1* | 7/2015 | Chen | G03F 7/70625 716/54 |
| 2015/0186582 A1* | 7/2015 | Chen | G03F 9/7076 716/54 |
| 2015/0227654 A1 | 8/2015 | Hunsche et al. | |
| 2015/0356233 A1 | 12/2015 | Fouquet et al. | |
| 2016/0042105 A1 | 2/2016 | Adel et al. | |
| 2016/0313651 A1* | 10/2016 | Middlebrooks | G06F 30/367 |
| 2017/0160648 A1 | 6/2017 | Tel | |
| 2018/0031981 A1 | 2/2018 | Vellanki et al. | |
| 2018/0088470 A1 | 3/2018 | Bhattacharyya | |
| 2018/0275521 A1 | 9/2018 | Wallow | |
| 2018/0322237 A1 | 11/2018 | Ten Berge et al. | |
| 2018/0364589 A1 | 12/2018 | Chen | |
| 2018/0373162 A1 | 12/2018 | Slotboom | |
| 2019/0025705 A1* | 1/2019 | Van Der Laan | G03F 7/70608 |
| 2022/0091965 A1* | 3/2022 | Tran | G06T 15/06 |

\* cited by examiner ial phase entry of PCT Patent Application No. PCT/
SELECTION OF MEASUREMENT LOCATIONS FOR PATTERNING PROCESSES This application is a continuation of U.S. patent application Ser. No. 17/214,456, which was filed on Mar. 26, 2021, now allowed, which is a continuation of U.S. patent application Ser. No. 16/067,303, which was filed on Jun. 29, 2018, now U.S. Pat. No. 10,962,886, which is the U.S. national phase entry of PCT Patent Application No. PCT/EP2016/081195, which was filed on Dec. 15, 2016, which claims the benefit of priority of U.S. Patent Application No. 62/273,662, which was filed on Dec. 31, 2015, each of the foregoing applications is incorporated herein in its entirety by reference.

FIELD

The present description relates generally to patterning processes and, more specifically, to selection of measurement locations for patterning processes.

BACKGROUND

Patterning processes take many forms. Examples include photolithography, electron-beam lithography, imprint lithography, inkjet printing, directed self-assembly, and the like. Often these processes are used to manufacture relatively small, highly-detailed components, such as electrical components (like integrated circuits or photovoltaic cells), optical components (like digital mirror devices or waveguides), magnetic components (like hard disk platters), and mechanical components (like accelerometers or microfluidic devices).

SUMMARY

Patterning processes are often operated close to the limits of the process's capabilities. Often it is desirable to pattern relatively small features with tight dimensional and overlay tolerances relative to the capabilities of the patterning equipment. With such features, more powerful, feature-rich, or less-expensive devices can often be obtained from a given suite of production equipment, relative to processes with less aggressive dimensioning. As a result, relatively small process variation, either in the patterning equipment, among incoming work-in-progress, or both, can consume a substantial portion of tolerance budget for the devices in a given patterning process.

In view of this limited room for error, manufacturers often engage in various metrology regimens to measure work-in-progress. These procedures typically monitor a process with measurements taken during or soon after (e.g., before subsequent processes) a process being monitored is performed. When measurements indicate a problem (e.g., due to upstream process drift), engineers often take corrective action. Monitoring is often done relatively quickly after a process is performed, before a substantial amount of work-in-progress is subjected to out-of-tolerance processes. This typically helps constrain the amount of product at risk. In some manufacturing lines, a device can take several weeks of processing until a completed product is formed and its operation tested (e.g., with automated electrical testing). Waiting until completion to test functionality of devices can place several weeks of production at risk. Thus, metrology regimens are often carefully designed to reduce this risk by selecting when and where work-in-progress is inspected.

The following is a non-exhaustive listing of some aspects of the present techniques. These and other aspects are described in the following disclosure.

Some aspects include a process of selecting a measurement location, the process including: obtaining pattern data describing a pattern to be applied to substrates in a patterning process; obtaining a process characteristic measured during or following processing of a substrate, the process characteristic characterizing the processing of the substrate; determining a simulated result of the patterning process based on the pattern data and the process characteristic; and selecting a measurement location for the substrate based on the simulated result.

Some aspects include a tangible, non-transitory, machine-readable medium storing instructions that when executed by a data processing apparatus cause the data processing apparatus to perform operations including the above-mentioned process.

Some aspects include a system, including: one or more processors; and memory storing instructions that when executed by the processors cause the processors to effectuate operations of the above-mentioned process.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
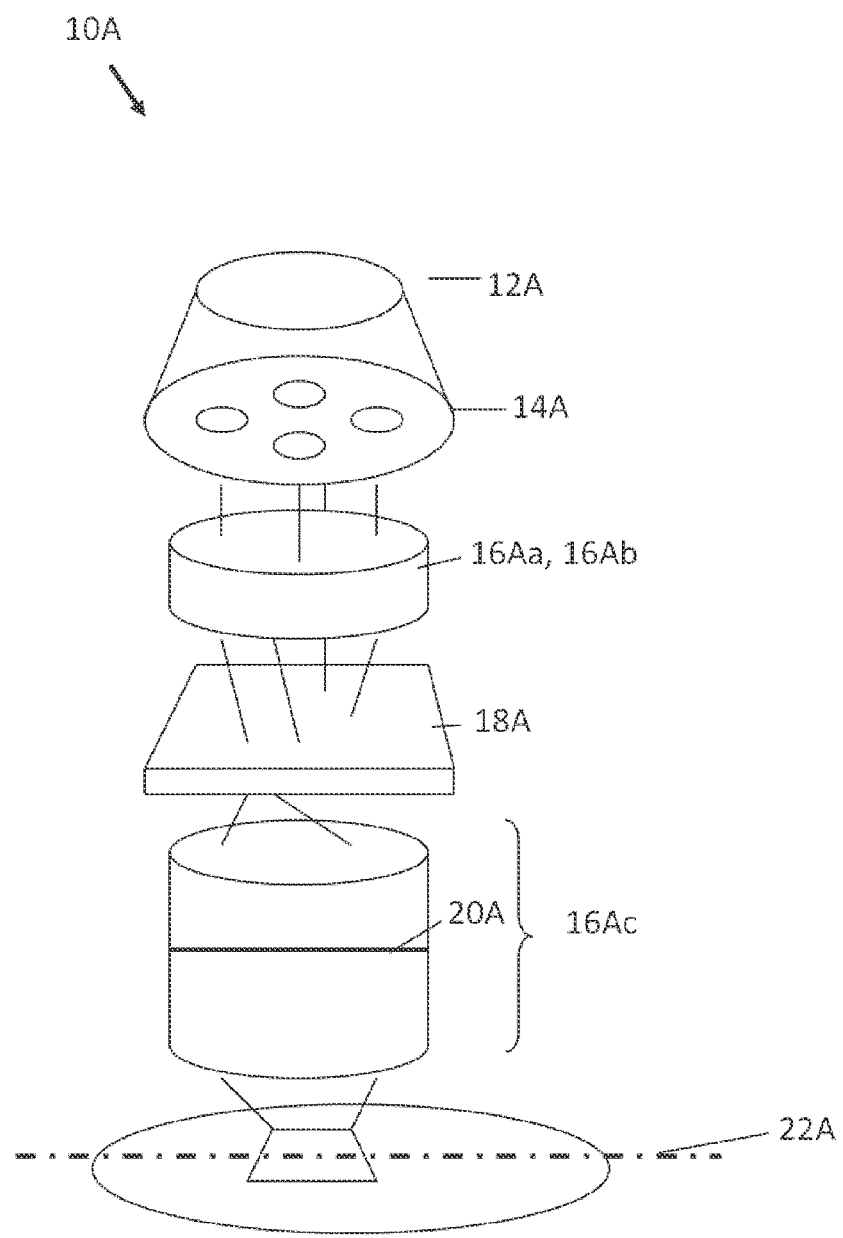
FIG. 1 is a block diagram of a lithography system.

While the invention is susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field of patterning technologies. Indeed, the inventors wish to emphasize the difficulty of recognizing those problems that are nascent and will become much more apparent in the future should trends in the lithography industry, and industries using similar processing techniques, continue as the inventors expect. Further, because multiple problems are addressed, it should be understood that some embodiments are problem-specific, and not all embodiments address every problem with traditional systems described herein or provide every benefit described herein. That said, improvements that solve various permutations of these problems are described below.

An aspect of a metrology regimen is a sampling scheme. Sampling is often used, in part, because devices created with patterning processes are relatively detailed. The intricacy is often such that measuring every feature of a pattern on ever copy of a pattern is cost and time prohibitive. Thus, work-in-progress (e.g., substrates, like semiconductor wafers, glass sheets, or polysilicon sheets) may be sampled (e.g., by measuring a subset of the features in a pattern, in a subset of the copies of a pattern (e.g., a die), on a subset of substrates, in a subset of collections of substrates (e.g., a "lot" of wafers, like in a front-opening unified pod or lot box). In many cases, traditionally, the sampling scheme is fixed. One example might specify that, after a given process, the fifth substrate in every even numbered lot is measured, or a randomly selected substrate in every lot is measured, and that the same five locations on each measured substrate are to be measured. Sampling schemes may be designed in view of the throughput of upstream, integrated, or downstream substrate processing equipment. For example, some lithographic apparatuses may include integrated metrology as part of a serial portion of a substrate flow through the equipment. A sampling scheme for the integrated metrology may have a number of measurement locations selected such that the throughput for measuring substrates is greater than or equal to the throughput of the (often much more expensive) lithography apparatus to avoid creating a bottleneck. In some cases, it may be desirable to optimize (or improve) the design of a sampling scheme subject to throughput constraints.

Existing sampling schemes often fail to detect process variation that affects yield. Substrates undergo, in many cases, hundreds of processing steps, and each of those steps may have dozens of different parameters that may vary and affect different parts of a substrate and a pattern differently. The combined effect of these variations make measurement samples less representative of the cumulative result than is desirable. As a result, in some cases, a substantial portion of the product of a manufacturing plant is determined to be defective, potentially causing the loss of all products produced over a several week duration by a plant that can cost well over four billion dollars. Further, even when yield is maintained, many sampling schemes add more time than is desirable to cycle time of substrates, and large numbers of metrology tools are expensive and consume valuable cleanroom space.

To mitigate these problems, or others, some embodiments intelligently and dynamically select measurement locations to sample based on computational lithography and known aspects of process variation. In some embodiments, a process condition map for a given substrate may indicate variation in measured process characteristics experienced by different parts of a substrate. A computational lithography model may be run under different process characteristic settings to output a modeled result of those variations. The modeled results may then be compared to tolerances for a design to indicate which parts of a substrate are more likely to have structures that are out of tolerance. This process may be repeated for each of several substrates to account for substrate-to-substrate variation. Based on which structures are deemed most likely to fail in the simulations, substrates to measure, copies of patterns to measure, and structures within patterns to measure may then be selected. Based on this selection, instructions on which substrates and sites to measure may be fed forward to a metrology tool, which may direct the tool's capacity to the sites most likely to lead to yield problems. Because expected "worst-case" locations are measured, it is expected that the remaining, un-measured portions of a substrate and lot are likely to yield tolerance-compliant devices.

Intelligently and dynamically selecting measurement locations is expected to provide one or more of a number of benefits, depending upon tradeoffs in process design. For example, better metrology may be used to improve process control. In some cases, a process may be operated with smaller features and tolerances, closer to the limits of the equipment's capabilities. Or some processes may experience higher yields, as problems are detected more quickly and equipment settings adjusted or substrates re-worked. Or cycle time may be reduced, as work-in-progress spends less time in and waiting on metrology equipment, a reduction afforded by smaller sample sizes of measurement locations that are faster to measure, while remaining sufficiently representative of a process. That said, these are merely examples, and other embodiments may be designed to target other tradeoffs and provide other benefits (e.g., permitting the use of less expensive and less capable metrology equipment, or less manufacturing floor space consumed by fewer instances of metrology equipment).

These techniques are best understood in view of an example of a type of patterning process.

A lithographic projection apparatus can be used, for example, in the manufacture of integrated circuits (ICs). In such a case, a patterning device (e.g., a mask) may specify a pattern corresponding to a layer of the IC ("design layout"), such as a via layer, an interconnect layer, or gate layer, or the like. This pattern, often forming part of a circuit, may be transferred onto a target portion (e.g. one or more dies in an exposure field) on a substrate (e.g., a silicon wafer) that has been coated with a layer of radiation-sensitive material (e.g., "resist"). Transfer techniques include irradiating the target portion through the circuit pattern on the patterning device. Often, a single substrate contains a plurality of adjacent target portions to which the circuit pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device may be transferred to one target portion progressively. Often, the lithographic projection apparatus will have a magnification factor M (generally <1), so the speed F at which the substrate is moved will be a factor M times that at which the projection beam scans the patterning device. More information about examples of some lithographic devices are described, for example, by U.S. Pat. No. 6,046,792, incorporated herein by reference.

A variety of processes may occur before and after exposure. Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation or diffusion (doping), metallization, oxidation, chemical-mechanical polishing, etc., to form a layer of the device. If several layers are required in the device, then variations on this procedure may be repeated for each layer, often with a different pattern specified by a different patterning device at each layer. Eventually, a device may be formed in each target portion on the substrate. These devices may then be separated from one another by a technique such as dicing or sawing, whence the individual devices can be mounted on a carrier, connected to pins, ball-grid arrays, etc. Or some embodiments may encapsulate devices before simulation.

As noted, lithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law." Often, layers of devices are manufactured using lithographic projection apparatuses that project a design layout onto a substrate using illumination from a deep-ultraviolet illumination source, creating individual functional elements having dimensions well below 100 nm, i.e., less than half the wavelength of the radiation from the illumination source (e.g., a 193 nm illumination source).

This process in which features with dimensions smaller than the classical resolution limit of a lithographic projection apparatus are printed, is commonly known as low-k1 lithography, according to the resolution formula CD=k1×λ/NA, where λ is the wavelength of radiation employed (often 248 nm or 193 nm for photolithography), NA is the numerical aperture of projection optics in the lithographic projection apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a circuit designer in order to achieve particular electrical functionality and performance.

To overcome these difficulties, fine-tuning steps are often applied to the lithographic projection apparatus or design layout. These include, for example, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. Examples of "projection optics" include components operating according to any of these design types for directing, shaping or controlling the projection beam of radiation, collectively or singularly. Examples of "projection optics" include optical components in a lithographic projection apparatus, no matter where the optical component is located on an optical path of the lithographic projection apparatus. Projection optics may include optical components for shaping, adjusting or projecting radiation from the source before the radiation passes the patterning device, or optical components for shaping, adjusting or projecting the radiation after the radiation passes the patterning device. The projection optics generally exclude the source and the patterning device.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle," "wafer," or "die" in this text should be considered as interchangeable with the more general terms "mask," "substrate," and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm). In some embodiments, examples of "radiation" and "beam" also include electrical radiation, such as electron beams or ion beams, by which patterns are transferred.

The term "optimizing" and "optimization" as used herein refers to or means adjusting a lithographic projection apparatus, a lithographic process, etc. such that results or processes of lithography have more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g., a local optimum, in at least one relevant metric, compared to an initial set of one or more values for those one or more parameters. These terms do not require identifying a global optimum and can encompasses improvements short of a global optimum. In an embodiment, optimization steps can be applied iteratively to provide further improvements in one or more metrics. Steps in which an error function or loss function is minimized (e.g., reduced to, or at least closer to, a minimum) in an optimizing process should be read as generic to steps in which signs are reversed and a fitness function is maximized (e.g., increased to, or at least closer to, a maximum), and vice versa.

In some embodiments, the lithographic projection apparatus may be of a type having two or more tables (e.g., two or more substrate table, a substrate table and a measurement table, two or more patterning device tables, etc.). In such "multiple stage" devices a plurality of the multiple tables may be used concurrently, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above may specify some or all of one or more design layouts (e.g., a portion of a design layout for double-patterning, or an entire layout). The design layout can be generated using CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit elements (such as gates, capacitors, etc.), vias, or interconnect lines, so as to reduce the likelihood of the circuit devices or lines interacting with one another in a material, undesirable way. One or more of the design rule limitations may be referred to as "critical dimensions" (CD). A critical dimension of a circuit, in some contexts, refers to the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" refers to a device that can be used to endow an incoming radiation beam with a patterned cross-section (which may unfold over time, e.g., in scanning or electron-beam lithography), corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

Non-optical patterning devices include an electron beam modulator coupled to a data source for a design layout and configured to spatially modulate the beam according to the layout. Other examples include a mold for imprint lithography and an inkjet printer, e.g., with electrically conductive or insulative ink.

As a brief introduction, FIG. 1 illustrates an example of a lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA = n \sin(\Theta max)$, n is the Index of Refraction of the media between the last element of projection optics and the substrate, and $\Theta max$ is the largest angle of the beam exiting from the projection optics that can still impinge on the substrate plane 22A. The radiation from the radiation source 12A may not necessarily be at a single wavelength. Instead, the radiation may be at a range of different wavelengths. The range of different wavelengths may be characterized by a quantity called "imaging bandwidth," "source bandwidth" or simply "bandwidth," which are used interchangeably herein. A small bandwidth may reduce the chromatic aberration and associated focus errors of the downstream components, including the optics (e.g., optics 14A, 16Aa and 16Ab) in the source, the patterning device and the projection optics. However, that does not necessarily lead to a rule that the bandwidth should never be enlarged.

In an optimization process of a patterning process using a patterning system, a figure of merit of the system can be represented as a cost function. The optimization process may include finding a set of parameters (e.g., design variables and parameter settings) of the system that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (e.g., worst deviation). "Evaluation points" may include any characteristics of the system, depending on the context. The design variables of the system can be confined to finite ranges and may be interdependent due to practicalities of implementations of the system. In the case of a lithographic projection apparatus, the constraints are often associated with physical properties and characteristics of the hardware such as tunable ranges, or patterning device manufacturability design rules, and the evaluation points can include physical points on a resist image on a substrate, as well as non-physical characteristics such as dose and focus.

In some examples of a lithographic projection apparatus, a source provides illumination (or other types of radiation) to a patterning device and projection optics direct and shape the illumination, via the patterning device, onto a substrate. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related to properties of the resist layer (e.g., only to these properties) (e.g., effects of chemical processes which occur during exposure, PEB and development). Optical properties of the lithographic projection apparatus (e.g., properties of the source, the patterning device and the projection optics) may dictate the aerial image. Since the patterning device used in the lithographic projection apparatus can be changed in some embodiments, it is often desirable to separate the optical properties of the patterning device from the optical properties of the rest of the lithographic projection apparatus including at least the source and the projection optics.

Figure 2:
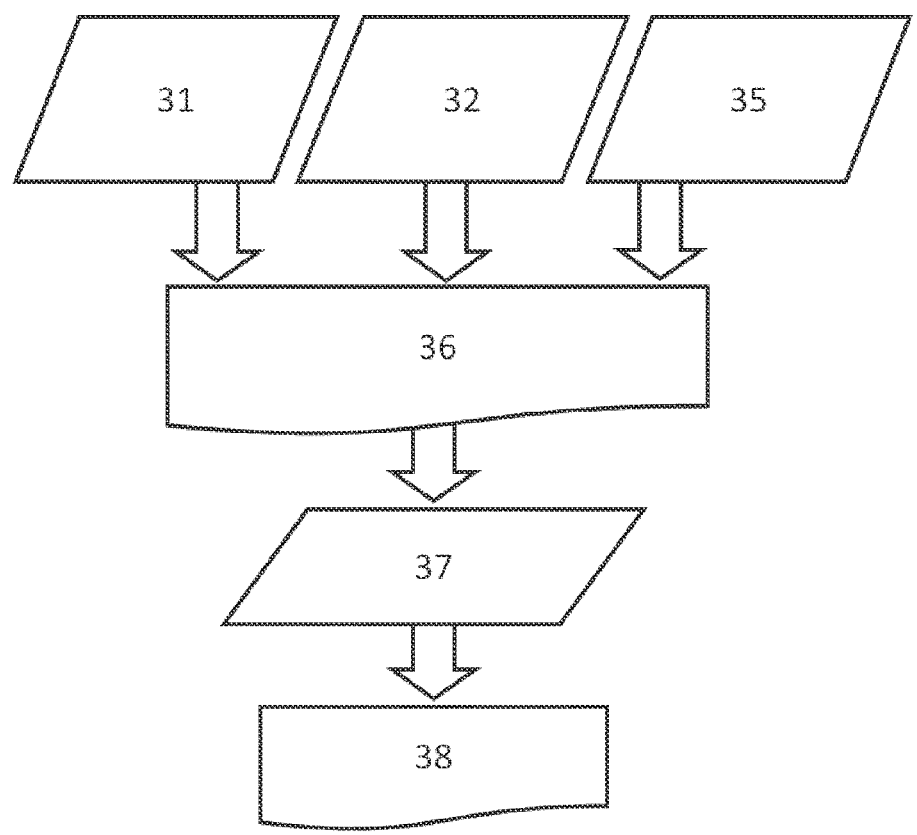
FIG. 2 is a block diagram of a pipeline of a simulation model of a patterning process.

An exemplary pipeline for simulating patterning processes is illustrated in FIG. 2. In this example, a source model 31 represents optical characteristics (including radiation intensity distribution, bandwidth and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image. In some embodiments, the simulation may yield spatial dimensions of simulated patterned structures formed on a simulated substrate by a simulated process, such as linewidths, sidewall taper or curvature, via diameters, fillet radii, chamfer radii, surface roughness, internal stress or strain, overlay, etc.

In some embodiments, the source model 31 may represent the optical characteristics of the source that include, for example, NA settings, sigma (σ) settings as well as any particular illumination shape (e.g. off-axis radiation sources such as annular, quadrupole, dipole, etc.). The projection optics model 32 may represent the optical characteristics of the projection optics, including aberration, distortion, one or more refractive indexes, one or more physical sizes, one or more physical dimensions, etc. The design layout model 35 may represent one or more physical properties of a physical patterning device, as described, for example, in U.S. Pat. No. 7,587,704, which is incorporated by reference in its entirety. The objective of the simulation is to predict, for example, edge placement, aerial image intensity slope or CD, which can then be compared against an intended design. The intended design is generally defined as a pre-OPC (optical proximity corrected) design layout which can be provided in a standardized digital file format such as GDSII or OASIS or other file format. In some embodiments, the pipeline of FIG. 2 may be executed by one or more of the computers described below with reference to FIG. 6. Examples of the pipeline of FIG. 2 include simulation software available from Brion Technologies Inc. of 4211 Burton Drive, Santa Clara, CA 95054, USA, such as software for process-window optimization or source-mask optimization, like Brion's Tachyon line of products.

In some embodiments, the models described with reference to FIG. 2, or other similar models, may be used to select measurement locations. The selection, in some embodiments, may be based on the distinct process conditions experienced by each substrate, in some cases accounting for process variation across substrates and within substrates. The selection may also be based on the particular pattern at issue and the different regions in that pattern that are sensitive to different process variations (or interactions between process variations).

Figure 3:
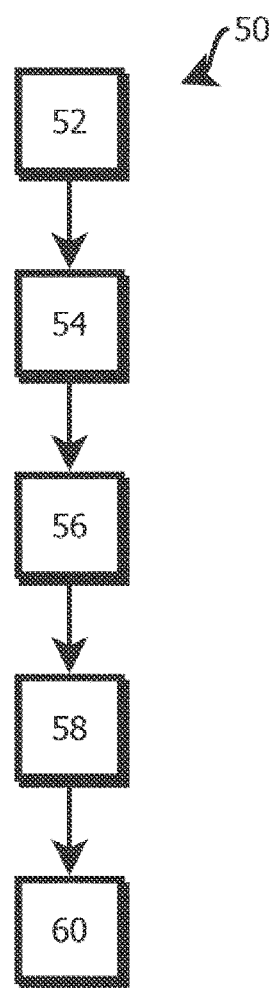
FIG. 3 is a flow chart showing an example of a process of selecting measurement locations for a substrate after undergoing a patterning process.

FIG. 3 shows an example of a process 50 for selecting a measurement location based on computational lithography simulation and process data. In some embodiments, the process 50 may be performed by one or more of the computer systems described below with reference to FIG. 6, such as in a blade of a rack-mounted computer of a lithography apparatus or metrology tool. In some cases, instructions for performing this process, and the other processes described herein, may be stored on a tangible, non-transitory machine-readable medium, such that when the instructions are read and executed by one or more processors, the operations described herein are effectuated. It should be noted that the process steps described herein may be performed in a different order from the order recited, which is not to suggest that any other aspect of certain embodiments described herein is limiting in any sense.

In some embodiments, multiple instances of some or all of the process 50 may be performed concurrently, with several instances of the process 50 being performed, for example in different threads or different computer systems, each for a portion of a substrate or for different substrates to expedite operation. In some embodiments, a given lithographic apparatus in a manufacturing line may operate at a cadence of between 100 and 300 substrates per hour. To meet or exceed this rate, some embodiments may execute instances of process 50 concurrently for different substrates, or some embodiments may perform process 50 for different subsets of the substrate on different computing devices. In some cases, process 50 may be executed for a sample of substrates, for example, less than one-half, one in ten, one in twenty, or the like, leaving time for a slower cadence or accommodating less-powerful computing equipment for executing the process 50.

In some embodiments, process 50 begins with obtaining pattern data describing a pattern to be applied to a plurality of substrates with a patterning process, as indicated by block 52. In some embodiments, the pattern data may be digital data, such as a design layout generated with electronic design automation software or an instance of the above-described design-layout model from FIG. 2, which may include a modified design layout that in includes optical proximity correction, phase-shift features, and other resolution enhancing features. The pattern may be any of a variety of different types of patterns, specifying, for instance, a layer of a semiconductor device, an optical device, or a mechanical device. In some cases, the pattern may specify a plurality of devices, for example, in a multi-device exposure field. In some cases, the pattern may include multiple instances of the same device, like an array of semiconductor dies repeated in a single exposure field. In some embodiments, the pattern data may specify both functional portions of devices, like transistor sources, gates, or drains; local or global interconnects; capacitors; and the like, as well as test structures, such as measurement sites (like pads for sensing film thickness, or grids for scatterometry measurements), for example, in scribe lines of the pattern. Patterns may also include alignment marks for aligning subsequent layers to a given layer.

In some embodiments, obtaining the pattern data may include receiving a lot box (or pod) of substrates, scanning a code on the lot, querying a database for a scheduled process for the respective lot of substrates, and retrieving from memory a corresponding file of the pattern data. In some cases, the same pattern may be applied to a plurality of substrates in a production run, for example 10 or more substrates in a lot box, like a front opening unified pod, and the pattern data may be obtained for the collection of substrates.

Next, some embodiments may obtain process characteristics measured during or following processing of the substrates, as indicated by block 54. Process characteristics may take a variety of forms, including process parameter setpoints for equipment (like focus or dose for photolithography, polishing speed or pressure for chemical-mechanical planarization, time or radio-frequency power for an etch, rotation speed or deposition time for chemical vapor deposition, or other setpoints). Process characteristics may also be observed process characteristics (like in situ measurements of processes and upstream measurements of substrates, for example, of film thickness at various locations, misalignment, critical dimensions, etc.). "Measured" process characteristic are not limited to process characteristics quantified with metrology equipment and can include feed-forward setpoints for equipment. In some cases, the process characteristic may be a measurement for another substrate in a lot or collection of substrates, with the measurement taken as representative of the collection of substrates. In some embodiments, a plurality of process characteristics may be obtained, for example, more than 2, more than 10, more than 100, or more than 1,000, depending upon the desired granularity of the analysis and available data. In some embodiments, process characteristics may be obtained from a plurality of upstream processes, for example, lithography, etch, chemical vapor deposition, chemical-mechanical planarization, sputter, electroplating, implant, diffusion, and the like.

In some embodiments, the process characteristics may be associated with locations on a substrate and identifiers of substrates where the process characteristics were observed or applied, for example, Cartesian coordinates within a die, exposure field, or substrate. The coordinates may correspond to things like film thickness measurements, or identifiers of exposure fields where particular focus, exposure, alignment, or deviation from a focal plane were experienced or applied. In some cases, the process characteristics may be retrieved with a process similar to how the pattern data was retrieved, for example, with factory-automation software by querying a database of a semiconductor manufacturing facility storing process data in response to receiving and identifying a collection of substrates.

As an illustrative example, a set of process characteristics may include a sampled measurement and location of critical dimensions of a previously patterned layer on the substrate, overlay misalignment measurements of various locations in an even earlier layer, and film thickness measurements at several measurement locations distributed around a substrate. In another example, the set of process characteristics may include measurements from endpoint detection sensors performing in situ measurements of a substrate undergoing chemical-mechanical planarization, measurements from endpoint detectors of sensors performing in situ measurements of a substrate undergoing a plasma etch, substrate planarity measurements provided by a manufacturer of a blank substrate, and scatterometry measurements of a collection of locations distributed over the substrate in a preceding lithography step. In these examples, different numbers and locations of obtained process characteristics may apply to each of the types of characteristic obtained. For example, there may be 5 film-thickness measurement locations and more than 1000 planarity measurements.

In some embodiments, obtaining process characteristics may include filtering process characteristics for anomalous data. Such data may be indicative of flawed sensor readings. In some embodiments, each obtained process characteristic may be compared to a threshold maximum or minimum value, which may be selected to be, for example, five standard deviations plus-or-minus a mean value historically observed for the characteristic. Some embodiments may discard obtained process characteristics that fail to satisfy these thresholds.

Obtaining a process characteristic may also include interpolating between and extrapolating from observed process characteristics. For example, a 300 millimeter (mm) circular substrate may be measured at five sites distributed across the substrate, and some embodiments may interpolate between the sites and extrapolate outside of the sites to infer film thickness, or other parameters. In some embodiments, such a sampling may be combined with a higher-resolution profile of the process characteristic expected to correspond to the obtained process characteristics. Often anomalous phenomena occur near the edge of substrates and make extrapolation less accurate than adjusting a profile that accounts for these anomalous phenomena to match or correspond with the obtain process characteristics further in from the edge.

As noted, obtaining process characteristics may include process characteristics measured (e.g., applied as a setpoint or sensed with in situ or ex situ measurements) during patterning of the substrate. This may include process characteristics from application of resist, soft bake of resist, patterning of the resist, or development or hard bake of the resist. In some embodiments, this includes leveling measurements taken prior to exposure, for example, a topographic mapping of a substrate prior to patterning, like with interferometry or capacitive measurements. In some embodiments, the process characteristic may be the portion of this topographic mapping that exceeds the capability of the patterning equipment to adapt to deviations in planarity, for example, obtained by filtering the sensed topographic map according to a threshold that indicates the maximum adjustment available to the patterning equipment. Other examples include intensity measurements of a radiation source, stage performance parameters, thermal distortion of optical elements, and parameters indicative of pre- or post-exposure processing of resist.

In some embodiments, the obtained process characteristic may be measured before a patterning process of a current layer of the substrate. As noted, substrates often include multiple layers, each patterned with a corresponding instance of a patterning process, often applying different patterns at each layer. These underlying layers may be formed with earlier deposition, etch, patterning, polishing, implant, electroplating, and other processing steps, each of which may give rise to process characteristics that may be obtained and may affect a current patterning process.

Next, some embodiments may determine a simulated result of the patterning process based on the pattern data and the respective process characteristics for the different substrates, as indicated by block 56. As noted, the process characteristics may be associated with a respective substrate to which the process characteristics apply. The association may be relevant in use cases where setpoints change, or processes drift, between processing of substrates. In some embodiments, the process characteristics may be ingested by the model described above with reference to FIG. 2, along with the pattern data. Collectively, this information and the corresponding models may model the patterning process. The obtained pattern data may be obtained in the form of the design layout model 35, and in some cases, the resist image may form a type of simulation result. In some cases, the simulated results may produce contours or critical dimensions expected to be obtained according to the model and the specific process characteristics experienced by the respective substrate. In some cases, contours may be expressed as a discrete sized voxels or as a polygon in a mesh, by way of example. In some embodiments, simulated results may be of sufficient granularity that surface roughness is specified.

The simulation results may depend, in part, on some types of the obtained process characteristic. For example, deviations from a focal plane greater than an amount for which the lithography equipment can compensate may be accounted for in the resist model, and corresponding portions of the resist image may reflect the result of impaired focus. In another example, misalignment to an underlying layer (or between underlying layers) may be encoded in the resist model, and simulation results may be positioned such that the effect of this misalignment carries through to the resist image. In another example, substrate-to-substrate or within-substrate variation in hard-bake temperatures may be accounted for by the resist model and reflected in the resist image. In some cases, characteristics of earlier processes may be known to bias alignment or leveling of a substrate during patterning (e.g., certain film thicknesses may produce optical effects due to constructive or destructive interference in alignment marks), and these effects may be accounted for in the resist model and reflected in the resist image.

This step 56 may further include comparing the simulated results to tolerances for the pattern. In some embodiments, electronic design automation software may indicate both a desired pattern, as well as acceptable variations or deviations from that pattern, thereby indicating tolerances. Examples include both a target critical dimension, as well as a maximum or minimum tolerance for the critical dimension, such as a line width, via diameter, sidewall angle, root mean square value for surface roughness, and the like. In some cases, comparing the simulated result to tolerances may include comparing a cumulative expected effect of the patterning process and the process characteristics to the tolerance, as earlier process steps characterized by the obtained process characteristics may consume part of a tolerance budget, leaving less room for variation in the patterning process. To account for this cumulative effect, before comparison with the simulation result, some embodiments may adjust a tolerance to a smaller tolerance based on the obtained process characteristic, e.g., variations in film thickness of a sidewall spacer may reduce leeway for overlay misalignment.

In some embodiments, the comparison between tolerances and simulation results may be a probabilistic comparison. For instance, a plurality of simulated results for a given substrate may be determined according to a Monte Carlo analysis. In some cases, a distribution of results or characteristics of the patterning process may be measured, specified, or inferred (e.g., variations in focus and exposure). That distribution may be sampled (e.g., pseudo-randomly) in each of multiple instances of simulating the patterning process for the substrate. In some embodiments, based on the plurality of simulation results for a given substrate under the Monte Carlo analysis, and comparison with tolerances for the pattern, a distribution of out of tolerance features may be obtained, e.g., some features may be out of tolerance in 5% of the simulation results, while other features are out of tolerance in 70% of the simulation results. In some cases, the amount by which a given feature is out of tolerance may be the frequency of out-of-tolerance results rather than a spatial distance.

Determining the simulation result may take many forms. In some embodiments, determining the simulation result may include simulating the patterning process after obtaining the process characteristic, e.g., at "run-time" of a patterning of a substrate. Or determining the simulation result may include selecting among previously run simulations. To select, some embodiments may identify a previously run simulation (e.g., run before the substrate began being processed in a manufacturing line) that relatively closely matches the obtain process characteristic. In some embodiments, to expedite processing, a plurality of simulations may be run in advance under a plurality of different permutations of the process characteristics, for example, a matrix in which process characteristics vary through a range. In some embodiments, each of these pre-run simulations may be associated with the process characteristics applied in the simulations and stored in an index in memory keyed to the process characteristic permutations. Some embodiments may select among or interpolate between these pre-run simulations with the obtained process characteristic, e.g., by determining which pre-run simulation was pre-run with a process characteristic that has the smallest difference from the obtained process characteristic.

Next, some embodiments may select measurement locations based on the simulated results, as indicated by block 58. Selecting measurement locations may include or constitute selecting a subset of the substrate in a collection of substrates, for example, one substrate in a lot, to be measured, or selecting measurement locations within that substrate. In some embodiments, the selection may be performed dynamically, after the substrate has entered the production line, and in some cases, after the substrate has been patterned in a given layer to be measured.

Selecting a substrate to measure (e.g., within a lot) may include determining which comparison between simulated results and tolerances for each of the substrates indicates the respective substrate is most likely to experience performance or yield failures. In some embodiments, substrates may be scored and ranked according to expected yield or performance, and the substrate having the lowest ranking, indicating the lowest yield or performance, may be selected for measurement. Low yield or performance may be indicated by a substrate's simulated result indicating features are likely to be out of tolerance.

Comparisons between tolerances and simulated results may be aggregated across a substrate with a variety of techniques. In some cases, a number of out of tolerance features may be summed. In some cases, a number of instances of a pattern (e.g., die) having at least one fatal out of tolerance feature may be counted. In some cases, a number of instances of a pattern having more than a threshold amount of out of tolerance features (e.g., more than an amount that can be accommodated by setting fuses later in a process, like are used in memory arrays with redundant memory that can be active with such fuses to salvage a die with inoperative portions) may be counted. Thus, in some cases, aggregate measures of comparisons between simulations and tolerances (both within a pattern and across a substrate) may depend both on an amount of out-of-tolerance features and the distribution of those features across the pattern and substrate.

Selecting a measurement location may include determining to measure some locations on a substrate and determining not to measure other locations. Often substrates include substantially more potential measurement locations than the metrology equipment and time available permit to be measured. That said, some embodiments may select a plurality of measurement locations on a substrate. For example, between 5 and 15 measurement locations in each die, exposure field or substrate for some types of metrology, or between 5 and 50 measurement locations for other types of metrology.

In some embodiments, selecting measurement locations may include determining which of the features of a pattern are expected to be outside of tolerances based on the above described comparisons and selecting measurement locations based on this determination. In some cases, some regions of substrates, for example, near an edge of the substrate, are not expected to yield, or yield at relatively low rates. In view of this, in some cases, out of tolerance simulated results in these regions may be discarded or down weighted in the selection to avoid solely measuring locations near the edge of a substrate, which is often not representative. (Or some embodiments may select locations without regard to yield, e.g., where processes are relatively uniform.) Similarly, some substrates may be so far out of tolerance that the substrate is not expected to yield, and the substrate, or measurement locations on the substrate may be discarded or down weighted in the selection. In some embodiments, the amount by which a simulated feature is out of tolerance may be compared to a threshold, and those features more than the threshold amount out of tolerance may be discarded as too far out of tolerance to be worth investigating. In some cases, all of the features in a simulated result may be within tolerance, in which case, negative values of a measure by which a feature is out of tolerance may be similarly analyzed, to select features that are close to a given tolerance relative to other instances of the feature on of the substrates or other areas of a substrate.

In some cases, based on filtering or weighting, a score may be calculated for each of a plurality of candidate measurement locations on a substrate. For example, candidate features may be filtered based on whether the candidate feature is within an area of a substrate not expected to yield and or too far over a tolerance to be expected to yield. Then, the candidate measurement locations may be weighted, for example, based on the expected yield in the area of the substrate, based on an amount the feature is expected to be in or out of tolerance, based on the sensitivity of the feature to process drift (e.g., a partial derivative of process drift to feature measurement), based on sensitivity of the feature to electrical/optical/mechanical performance of a finished product (e.g., a partial derivative of performance to feature measurement), or based on a type of product being formed in the pattern (e.g., in a multiproduct exposure field, where some products are more sensitive). The scored candidate locations may then be ranked according to the score, and those having less than a threshold rank may be selected as measurement locations. The threshold may be chosen based on an available amount of time for performing the measurements, current backlog of the metrology equipment indicated by factory automation systems, and speed with which the metrology equipment performs those measurements.

In some cases, measurement locations may be selected according to a time or location budget. For example, some embodiments may allocate a certain amount of time, for example, 20 minutes, to each lot of substrates, and embodiments may then allocate that budget according to the analysis described above. In some cases, this allocation may span between multiple substrates in a lot, such that one lot may have two substrates subjected to five measurements each, and another lot may have a single substrates subjected to 15 measurements (as some portion of the time budget may be consumed by loading and unloading and aligning to each substrate).

In some embodiments, only a portion of the measurement locations are selected dynamically. In some embodiments, a portion of the measurement locations may be the same between each collection of substrates to facilitate detection of process drift by comparing substrates that should be similar or to ensure that a substrate from each track of a dual-track lithography system is measured.

Next, some embodiments may export the measurement locations to metrology tool. A variety of types of metrology tools may be used. In some cases, the metrology tool may be integrated into process equipment, for example, an integrated scatterometry metrology tool of a lithographic apparatus. Other types of metrology tools, which may be integrated or standalone, include electron-beam inspection (e.g., automated electron-beam inspection), bright-field inspection, profilometers, atomic force microscopes, and the like. In some embodiments, the exported measurement locations may be exported as a serialized data format identifying the substrate and specifying coordinates of measurement locations, as well as process recipes for the measurement at each of those locations. In some cases, the locations may be specified as a substrate, exposure field, die, location within the die, and a rule to determine whether the obtained measurement is in or out of specification. One example of such a rule specifies an edge detection algorithm for processing an image of the substrate and a tolerance for a distance between edges. In another example, the rule may specify permissible variations in sidewall shapes for scatterometry measurements, along with angles and spectra by which the measurements are to be taken.

Figure 4:
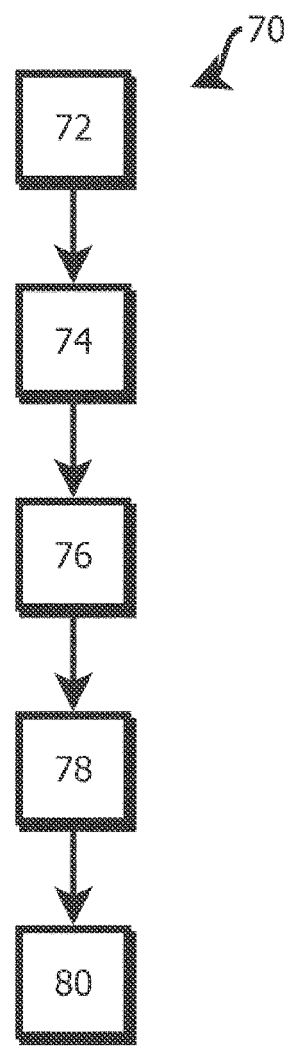
FIG. 4 is a flow chart showing an example of a process of monitoring a patterning process by measuring at locations selected with the process of FIG. 3.

FIG. 4 depicts an example of a process 70 of monitoring a patterning process. In some embodiments, this process 70 may be performed during operation of a semiconductor manufacturing facility, or other manufacturing facility using patterning processes. In this example, the process 70 includes obtaining a substrate, as indicated by block 72. In some cases, the substrate may be a 200, 300, or 450 mm silicon wafer, for example, within a front opening unified pod housing a collection of the wafers. Or a variety of other materials may form a base for the substrate, such as glass, gallium nitride, indium phosphide, or polysilicon. Next, some embodiments may pattern the substrate, as indicated by block 74. Patterning the substrate may include patterning the substrate with one of the lithographic apparatuses described herein. Next, some embodiments may obtain measurement locations on the substrate, as indicated by block 74. This step may be performed with the process of FIG. 3, and may include obtaining a determination of whether to measure the substrate, or whether to measure a different substrate in the collection of substrates. Next, some embodiments may measure a structure formed with the patterning process at the measurement location, as indicated by block 76. This measurement may be performed with one of the tools referenced in the discussion of step 60 above. Next, some embodiments may determine that the structure is out of tolerance based on the measurement, as indicated by block 78. Based on this determination, a number of remedial actions may be taken, as indicated by block 80. In one example, in response, some embodiments may measure additional substrates or measurement locations. In some cases, the selection of additional substrates or measurement locations may be performed by increasing the time budget or increasing the rank-cutoff thresholds described above with reference to FIG. 3. In another example of remedial action, some embodiments may rework the substrate, for example, by stripping off patterned resist and re-patterning the substrate. In another example, some embodiments may adjust a parameter of the patterning process, for example, with feedback control, like according to a proportional-integral-derivative feedback control algorithm. In another example, some embodiments may reject the substrate, for example, scrapping the substrate and avoiding the cost of incurring additional processing of a substrate that may be too far out of tolerance to yield.

Figure 5:
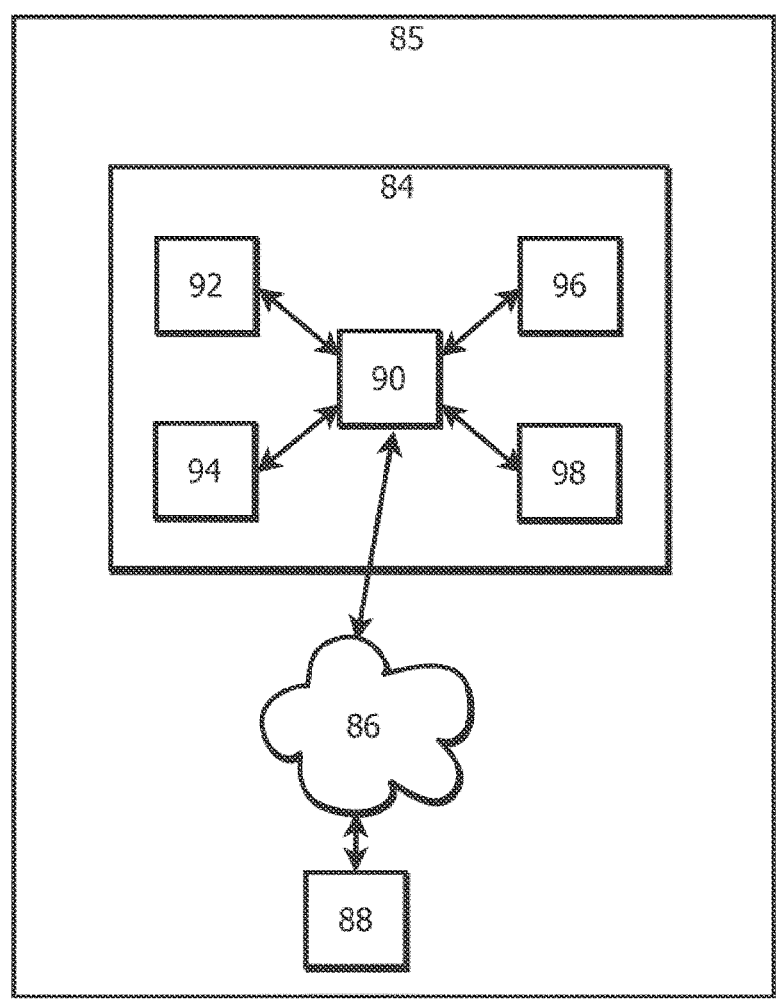
FIG. 5 is a block diagram of the logical architecture of an example of a system that performs the process of FIG. 3.

FIG. 5 illustrates the logical architecture of an example of a system 84 configured to perform the process of FIG. 3, e.g., while performing the process of FIG. 4. In some embodiments, the system 84 is embodied in a rack-mounted computer system of a lithography apparatus having an integrated metrology tool. The system 84 may be disposed in a semiconductor manufacturing facility 85. System 84 may be connected via a local area network 86 to a factory automation system 88 storing process state of the substrates, process characteristics previously acquired for the substrates, and definitions of processes the substrates have and will undergo. In this example, the system 84 includes a controller 90, a pattern data repository 92, a process characteristic acquisition module 94, a patterning process simulator 96, and a measurement location selector 98. The controller 90 may direct the operation of the other components, request data from and update the factory automation system 86, export instructions to metrology equipment to measure at selected locations, and determine whether to take remedial actions. The pattern data repository 92 may include examples of the above described pattern data. The process characteristic acquisition module 94 may be configured to receive, filter, interpolate between, and extrapolate from process characteristics as described above. The patterning process simulator 96 may be configured to perform the above described steps to determine a simulation result, e.g., with the model pipeline of FIG. 2, based on data acquired from modules 92 and 94. The measurement location selector 98 may be configured to select substrates to measure and locations on those substrates to measure by performing the above described steps to select these parameters.

Thus, some embodiments may use simulated patterning processes, adjusted to reflect different process characteristics applied to each substrate and portion of the substrate, to select the worst-case measurement locations on substrates. This technique, in some cases, is expected to direct metrology resources relatively effectively and provide for one or more of the above described benefits that may be obtained in some embodiments.

Figure 6:
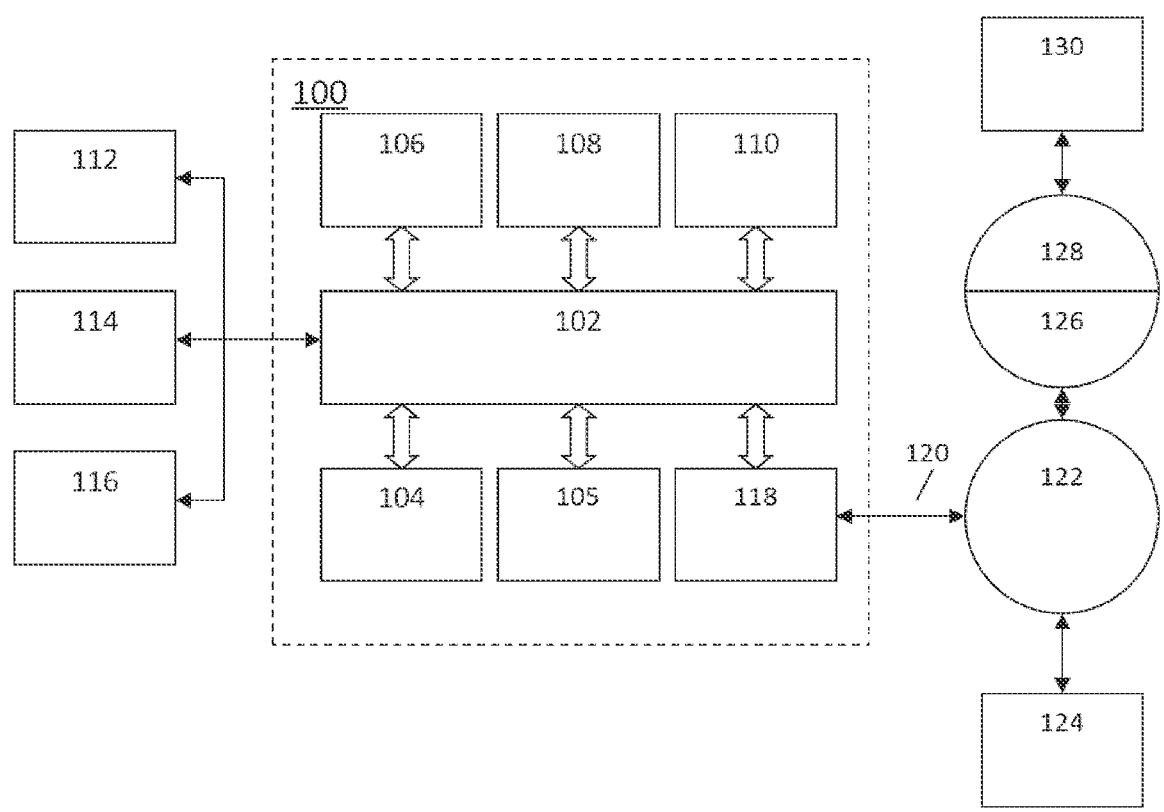
FIG. 6 is a block diagram of an example computer system.

FIG. 6 is a block diagram that illustrates a computer system 100 that may assist in implementing the simulation, characterization, and qualification methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. The computer need not be co-located with the patterning system to which an optimization process pertains. In some embodiments, the computer (or computers) may be geographically remote.

The term "computer-readable medium" as used herein refers to any tangible, non-transitory medium that participates in providing instructions to processor 104 for execution. Such a medium may take many forms, including non-volatile media and volatile media. Non-volatile media include, for example, optical or magnetic disks or solid state drives, such as storage device 110. Volatile media include dynamic memory, such as main memory 106. Transmission media include coaxial cables, copper wire and fiber optics, including the wires or traces that constitute part of the bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. In some embodiments, transitory media may encode the instructions, such as in a carrier wave.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 7:
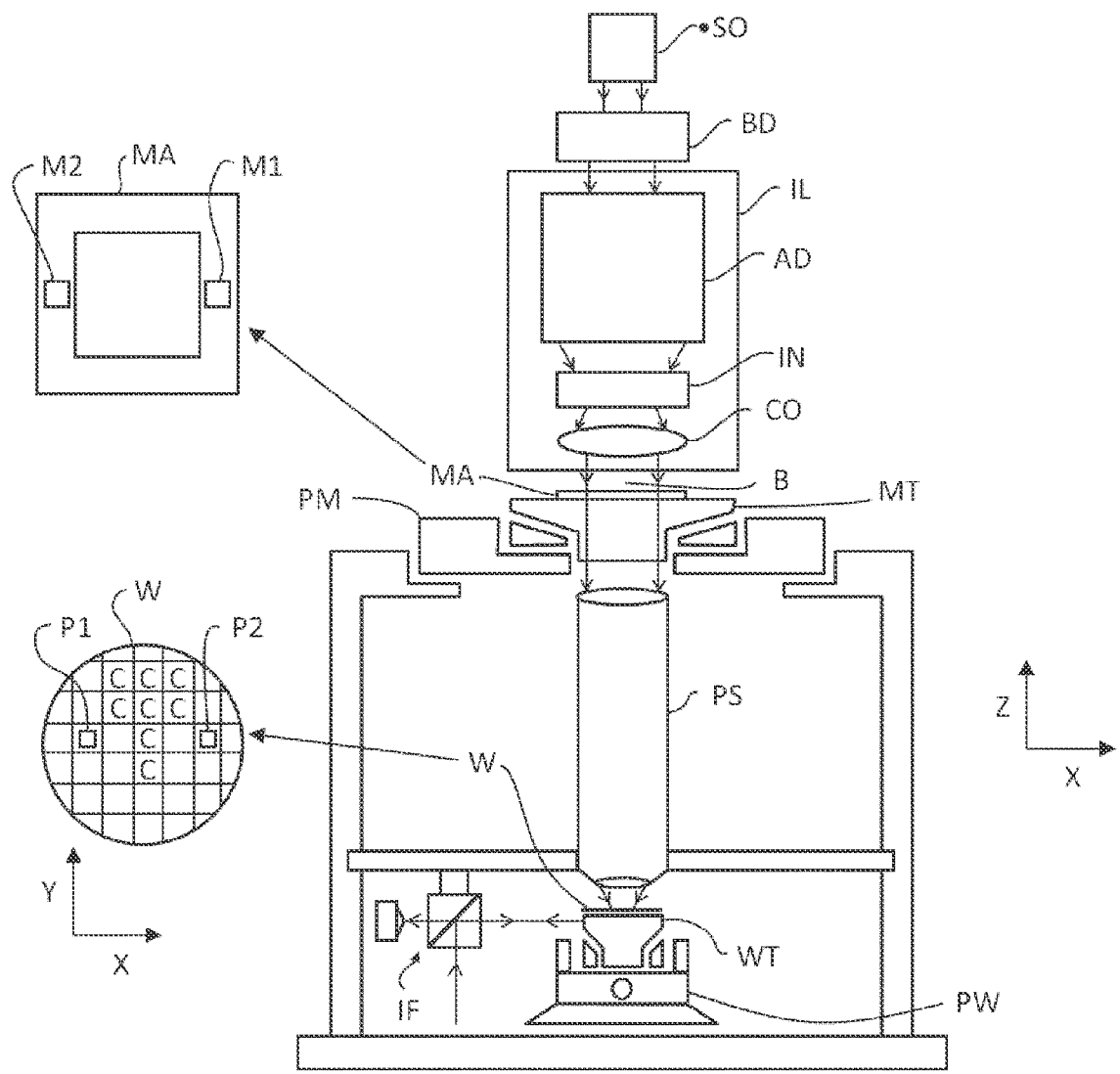
FIG. 7 is a schematic diagram of another lithography system.

FIG. 7 schematically depicts an exemplary lithographic projection apparatus whose process window for a given process may be characterized with the techniques described herein. The apparatus comprises:
- an illumination system IL, to condition a beam B of radiation. In this particular case, the illumination system also comprises a radiation source SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as □-outer and □-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross section.

It should be noted with regard to FIG. 7 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or F2 lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 7. However, in the case of a stepper (as opposed to a step-and-scan tool) the patterning device table MT may just be connected to a short stroke actuator, or may be fixed.

The depicted tool can be used in two different modes:
- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 8:
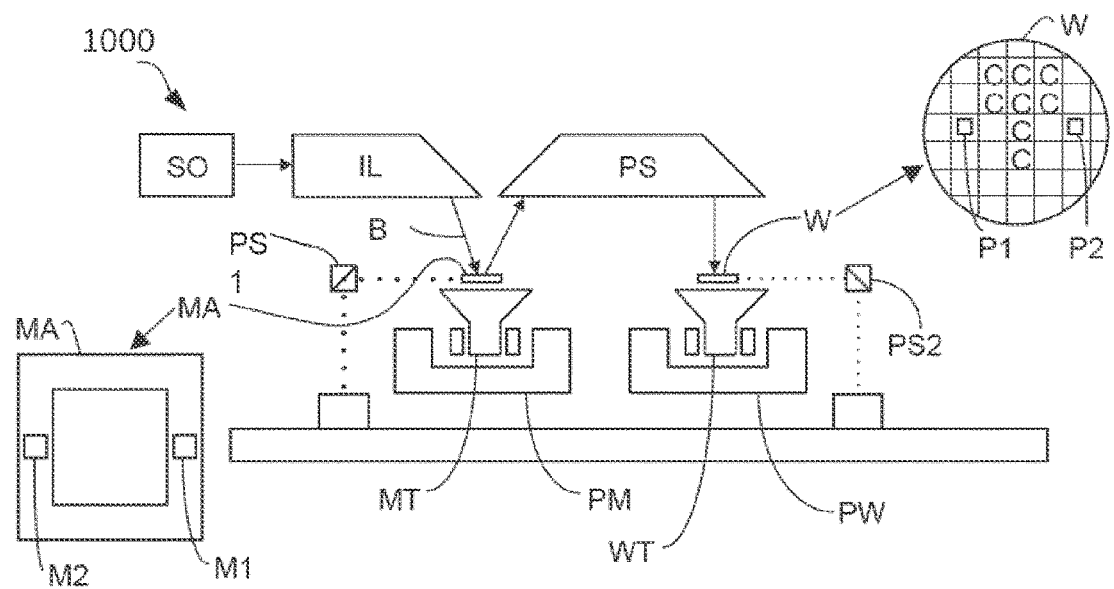
FIG. 8 is a schematic diagram of another lithography system.

FIG. 8 schematically depicts another exemplary lithographic projection apparatus 1000 whose process window for a given process may be characterized with the techniques described herein.

The lithographic projection apparatus 1000, in some embodiments, includes:
- a source collector module SO
- an illumination system (illuminator) IL configured to condition a radiation beam B (e.g. EUV radiation).
- a support structure (e.g. a patterning device table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

As shown in FIG. 8, in some embodiments, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 8, for providing the laser beam exciting the fuel. The resulting plasma emits output radiation, e.g., EUV radiation, which is collected using a radiation collector, disposed in the source collector module. The laser and the source collector module may be separate entities, for example, when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors or a beam expander. In other cases the source may be an integral part of the source collector module, for example when the source is a discharge produced plasma EUV generator, often termed as a DPP source.

The illuminator IL may include an adjuster for adjusting the angular intensity distribution of the radiation beam. Generally, at least the outer or inner radial extent (commonly referred to as σ-outer and σ-inner, respectively) of the intensity distribution in a pupil plane of the illuminator can be adjusted, in some embodiments. In addition, the illuminator IL may include various other components, such as faceted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device, in this example. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometer, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 may be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.
3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that uses programmable patterning device, such as a programmable mirror array of a type as referred to above.

Figure 9:
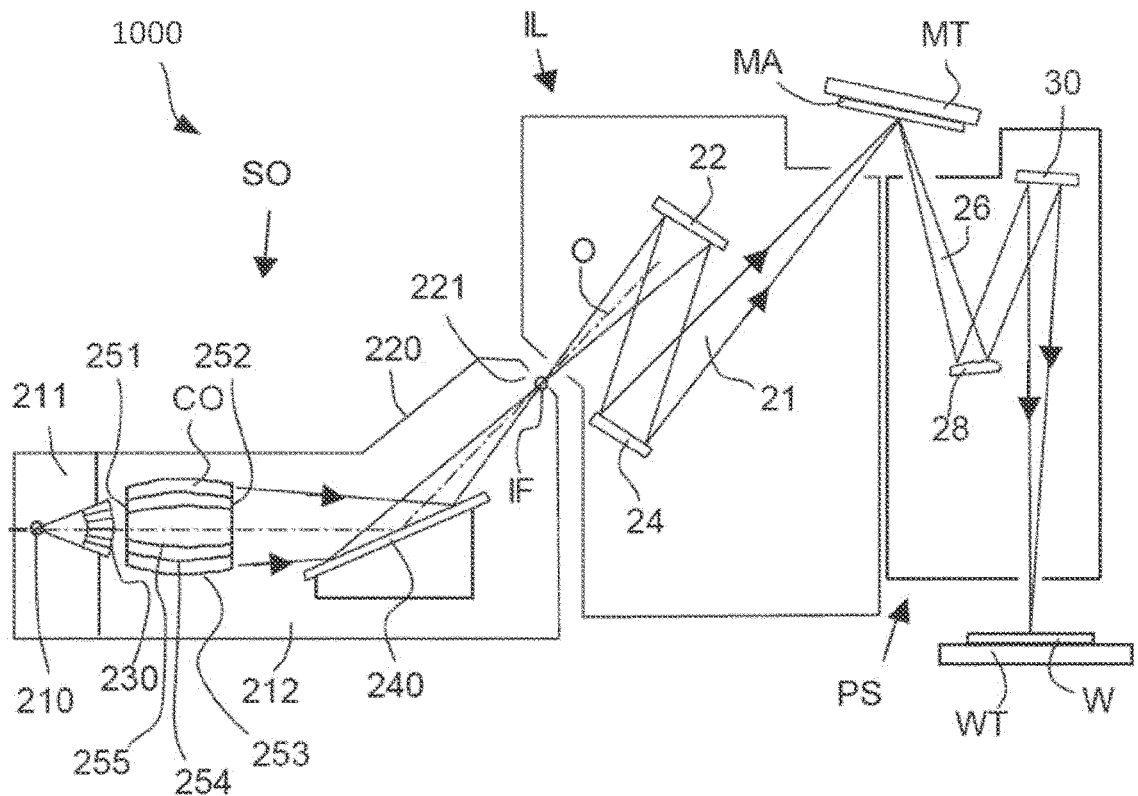
FIG. 9 is a more detailed view of the system in FIG. 8.

FIG. 9 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 9.

Collector optic CO, as illustrated in FIG. 9, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 10:
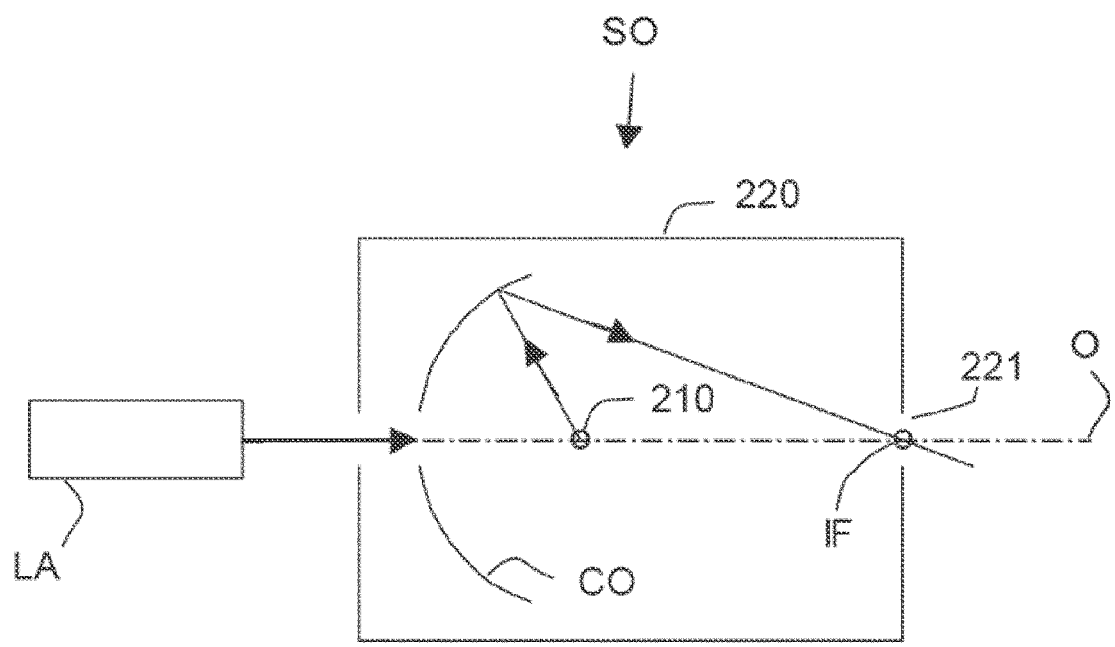
FIG. 10 is a more detailed view of the source collector module SO of the system of FIGS. 8 and 9.

Alternatively, the source collector module SO may be part of an LPP radiation system as shown in FIG. 10. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

U.S. Patent Application Publication No. US 2013-0179847 is hereby incorporated by reference in its entirety.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, embodiments of the present invention may be practiced with other computer system configurations.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to cost constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims. Further modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

In this patent, certain U.S. patents, U.S. patent applications, or other materials (e.g., articles) have been incorporated by reference. The text of such U.S. patents, U.S. patent applications, and other materials is, however, only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference in this patent.

The present techniques will be better understood with reference to the following enumerated clauses:

1. A method of selecting a measurement location, the method comprising: obtaining pattern data describing a pattern to be applied to substrates in a patterning process; obtaining a process characteristic measured during or following processing of a substrate, the process characteristic characterizing the processing of the substrate; determining a simulated result of the patterning process based on the pattern data and the process characteristic; and selecting a measurement location for the substrate based on the simulated result.
2. The method of clause 1, wherein: obtaining pattern data comprises obtaining a reticle model or design layout.
3. The method of clause 1, wherein: obtaining a process characteristic comprises obtaining a process characteristic measured during patterning of the substrate.
4. The method of clause 3, wherein: obtaining a process characteristic measured during patterning of the substrate comprises: obtaining a leveling measurement indicative of an orientation of at least part of a surface of the substrate relative to a lithography apparatus performing the patterning process.
5. The method of clause 4, wherein the leveling measurement is part of a topographic mapping of a surface of the substrate by the lithography apparatus.
6. The method of any of clauses 3 to 5, wherein: obtaining a process characteristic measured during patterning of the substrate comprises: obtaining an intensity of a radiation source used in the patterning process.
7. The method of any of clauses 3 to 6, wherein: obtaining a process characteristic measured during patterning of the substrate comprises: obtaining a stage performance parameter of a stage holding the substrate during at least part of the patterning process.
8. The method of any of clauses 3 to 7, wherein: obtaining a process characteristic measured during patterning of the substrate comprises: obtaining a value indicative of thermal distortion of an optical element used in the patterning process.
9. The method of any of clauses 3 to 8, wherein: obtaining a process characteristic measured during patterning of the substrate comprises: obtaining a value indicative of pre or post exposure processing of resist during the patterning process.

10. The method of any of clauses 1 to 9, wherein: obtaining a process characteristic comprises: obtaining a process characteristic measured before at least one process of patterning the substrate.
11. The method of clause 10, wherein: obtaining a process characteristic measured before at least one process of patterning the substrate comprises: obtaining a film thickness of a layer of the substrate.
12. The method of any of clauses 10 to 11, wherein: obtaining a process characteristic measured before at least one process of patterning the substrate comprises: obtaining a value indicative of an amount of misalignment between patterns in two layers of the substrate.
13. The method of any of clauses 1 to 12, wherein: determining a simulated result of the patterning process comprises: simulating the patterning process with means for modeling the patterning process.
14. The method of any of clauses 1 to 13, wherein: determining a simulated result of the patterning process comprises: predicting a dimension of a pattern applied to the substrate based on a computational lithographic simulation comprising: a projection optics model; and a resist model.
15. The method of any of clauses 1 to 14, wherein: selecting the measurement location for the substrate based on the simulated result comprises: comparing the simulated result to tolerances for the pattern and selecting the measurement location based on differences between respective tolerances and corresponding structures in the simulated result.
16. The method of any of clauses 1 to 15, comprising: obtaining additional values of the process characteristic, the additional values being measured during or following the processing of a plurality of substrates including the substrate; simulating the patterning process for each of the plurality of substrates based on the pattern data and corresponding instances of the process characteristic to produce a plurality of simulation results; and selecting the substrate from among the plurality of substrates based on the plurality of simulated results, the substrate being selected to undergo a measurement.
17. The method of any of clauses 1 to 16, comprising: scoring a plurality of candidate measurement locations based on differences between the simulated result and tolerances of the pattern; and selecting measurement locations, including the measurement location, from among the candidate measurement locations based on relative values of the scores.
18. The method of clause 17, comprising: filtering a candidate measurement location from consideration based on a likelihood of a device corresponding to the filtered candidate measurement location yielding a functioning device being below a threshold value.
19. The method of any of clauses 17 to 18, wherein selecting measurement locations comprises: weighting the scores based on one or more of the following parameters and selecting based on relative values of the weighted scores: a type of product being patterned in a multi-product exposure field; a sensitivity of the candidate measurement location to process drift; or a sensitivity of the candidate measurement location to electrical, optical, or mechanical performance in device being patterned.
20. The method of any of clauses 1 to 19, comprising: measuring the substrate at the measurement location; and adjusting the patterning process based on a measured value from the measurement location.
21. The method of any of clauses 1 to 20, wherein: obtaining pattern data comprises obtaining a model characterizing spatial modulation of radiation by a reticle over an area of the pattern; obtaining the process characteristic comprises: obtaining, from a lithographic apparatus having the reticle, a mapping of two or more process parameters to more than ten locations on the substrate, the process parameters being measured by the lithography apparatus while processing the substrate; determining the simulated result of the patterning process comprises either or both of the following: simulating the effect of the lithographic apparatus on resist on the substrate based on different values of the process parameters at different locations on the substrate with a computational lithographic model of the lithographic apparatus; or selecting among a plurality of simulation results from previously run simulations based on which of the previously run simulations was run with simulation parameters that correspond to at least some of the process parameters; selecting the measurement location for the substrate based on the simulated result comprises: comparing simulated contours of resist to tolerances of the pattern; determining to measure the substrate based on the comparison; selecting a plurality of measurement locations on the substrate based on the comparison; the method comprising: exporting the plurality of measurement locations to a scatterometry metrology tool.
22. The method of any of clauses 1 to 21, comprising: forming a plurality of devices on the substrate.
23. A system, comprising: one or more processors; and memory storing instructions that when executed by at least some of the processors effectuate operations comprising: obtaining pattern data describing a pattern to be applied to a substrate in a patterning process; obtaining a process characteristic measured during or following processing of a substrate, the process characteristic characterizing the processing of the substrate determining a simulated result of the patterning process based on the pattern data and the process characteristic; and selecting a measurement location for the substrate based on the simulated result.
24. The system of clause 23, comprising: a lithographic apparatus configured to pattern the substrate and being simulated in the simulated result; or a metrology tool configured to inspect the substrate at the measurement location.
25. The system of any of clauses 23 to 24, wherein the operations comprise the operations of any of clauses 1 to 22.
26. A tangible, non-transitory, machine readable media storing instructions that when executed by a data processing apparatus effectuate operations comprising: the operations of any of clauses 1 to 22.

The invention claimed is:
1. A method comprising:
obtaining process characteristic data based on measurement during, or following, processing of a substrate of a plurality of substrates, the process characteristic data characterizing the processing of the substrate in a patterning process;
determining, by a hardware computer, a predicted result of the patterning process based on pattern data describing a pattern applied to the substrates in the patterning process and the process characteristic data; and selecting, based on the predicted result, a location for at least one substrate of the substrates where at least a feature of the pattern is, or expected to be, a failure or out of tolerance.

2. The method of claim 1, wherein obtaining process characteristic data comprises obtaining a process characteristic measured during patterning of the substrate.

3. The method of claim 1, comprising:
measuring the substrate at the location; and
adjusting the patterning process based on a measured value from the location.

4. A tangible, non-transitory, machine readable media storing instructions that when executed by a data processing apparatus effectuate operations comprising the operations of claim 1.

5. The method of claim 1, further comprising controlling or modifying the patterning process using a feedforward or feedback based on the location.

6. The method of claim 1, further comprising performing an e-beam measurement or inspection based on the location.

7. The method of claim 1, further comprising converting measurement data during, or following, processing of the substrate into the process characteristic data, the measurement data having a lower resolution than the process characteristic data.

8. Non-transitory, machine readable media storing instructions therein, the instructions, when executed by a data processing apparatus, configured to cause the data processing apparatus to at least:
obtain process characteristic data based on measurement during, or following, processing of a substrate of a plurality of substrates, the process characteristic data characterizing the processing of the substrate; and
identify, based on pattern data describing a pattern to be applied to the substrates in a patterning process, on the process characteristic data and on a predicted, computed or modeled result relating thereto, a location for at least one substrate of the substrates where at least a feature of the pattern is, or expected to be, out of tolerance.

9. The media of claim 8, wherein the process characteristic data is obtained from measurement during patterning of the substrate.

10. The media of claim 8, wherein the instructions are further configured to cause the data processing apparatus to cause adjustment of the patterning process based on a measured value from the location.

11. The media of claim 8, wherein the instructions are further configured to cause the data processing apparatus to cause control or modification of the patterning process using a feedforward or feedback based on the location.

12. The media of claim 8, wherein the instructions are further configured to cause the data processing apparatus to cause performance of an electron beam measurement or inspection based on the location.

13. The media of claim 8, wherein the instructions are further configured to cause the data processing apparatus to convert measurement data during, or following, processing of the substrate into the process characteristic data, the measurement data having a lower resolution than the process characteristic data.

14. The media of claim 8, wherein process characteristic data comprises measurement data obtained from an electron beam measurement or inspection tool.

15. Non-transitory, machine readable media storing instructions therein, the instructions, when executed by a data processing apparatus, configured to cause the data processing apparatus to at least:
obtain process characteristic data based on measurement during, or following, processing of a substrate of a plurality of substrates, the process characteristic data characterizing the processing of the substrate; and
identifying, using a predicted, computed or modeled result determined at least based on pattern data describing a pattern to be applied to the substrates in a patterning process and using the process characteristic data, a location for at least one substrate of the substrates where at least a feature of the pattern is, or expected to be, out of tolerance.

16. The media of claim 15, wherein the process characteristic data is obtained from measurement during patterning of the substrate.

17. The media of claim 15, wherein the instructions are further configured to cause the data processing apparatus to cause adjustment of the patterning process based on a measured value from the location.

18. The media of claim 15, wherein the instructions are further configured to cause the data processing apparatus to cause control or modification of the patterning process using a feedforward or feedback based on the location.

19. The media of claim 15, wherein the instructions are further configured to cause the data processing apparatus to cause performance of an e-beam measurement or inspection based on the location.

20. The media of claim 15, wherein the instructions are further configured to cause the data processing apparatus to convert the measurement data during, or following, processing of the substrate into the process characteristic data, the measurement data having a lower resolution than the process characteristic data.

* * * * *